United States Patent [19]

Chaudhari et al.

[11] 4,046,618

[45] Sept. 6, 1977

[54] METHOD FOR PREPARING LARGE SINGLE CRYSTAL THIN FILMS

[75] Inventors: Praveen Chaudhari, Briarcliff Manor; Jerome John Cuomo, Bronx; John Wauchope Matthews, Ossining, all of N.Y.

[73] Assignee: International Business Machines Corporation, Armonk, N.Y.

[21] Appl. No.: 553,194

[22] Filed: Feb. 26, 1975

Related U.S. Application Data

[63] Continuation of Ser. No. 319,125, Dec. 29, 1972, abandoned.

[51] Int. Cl.² ............................................ B01J 17/08
[52] U.S. Cl. ................................ 156/603; 156/617 R
[58] Field of Search .................... 156/603, 617–620, 156/DIG. 88; 23/273 SP

[56] References Cited

U.S. PATENT DOCUMENTS

| 2,992,903 | 7/1961 | Imber | 23/273 SP |
|---|---|---|---|
| 3,332,796 | 7/1967 | Kooy | 156/603 |
| 3,348,962 | 10/1967 | Grossman et al. | 156/DIG. 88 |
| 3,585,088 | 6/1971 | Schwuttke et al. | 156/603 |
| 3,655,439 | 4/1972 | Seiter | 156/603 |
| 3,779,801 | 12/1973 | Halloway et al. | 156/603 |

*Primary Examiner*—Hiram H. Bernstein
*Attorney, Agent, or Firm*—Andrea P. Bryant; B. N. Wiener; J. B. Wynn

[57] ABSTRACT

A method of making a large single crystal thin film not dependent upon the size or temperature resistance of the substrate crystal by first depositing an amorphous film of the crystalline material to be produced followed by heating of the amorphous film in such a manner that nucleation of epitaxial grains is propagated through the amorphous film whereby a single crystal thin film is produced.

2 Claims, 13 Drawing Figures

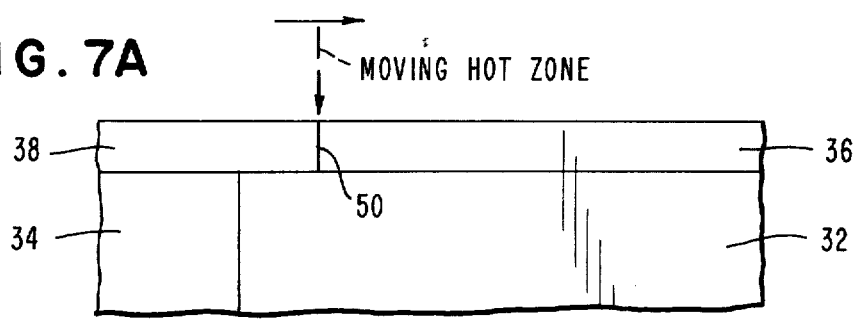
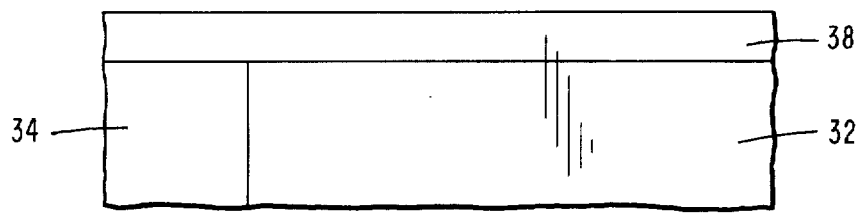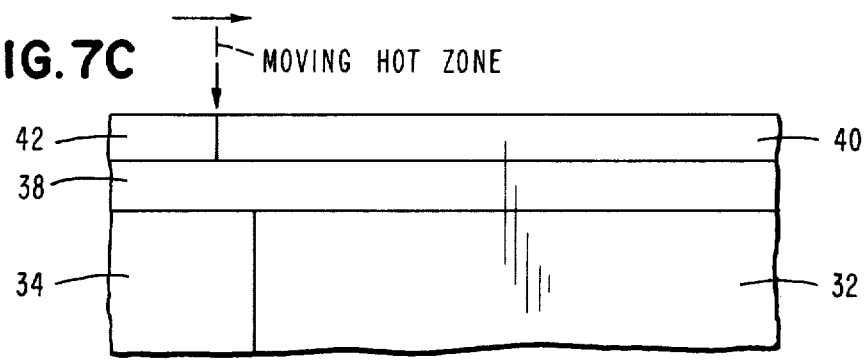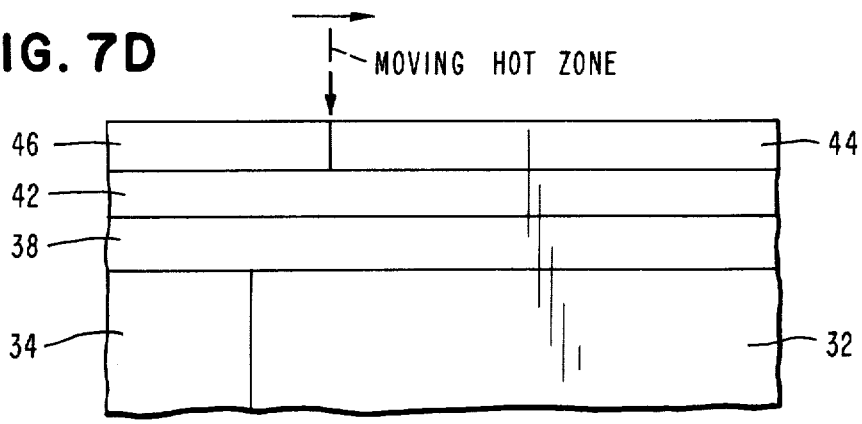

METHOD FOR PREPARING LARGE SINGLE CRYSTAL THIN FILMS

This is a continuation of application Ser. No. 319,125, filed Dec. 29, 1972, and now abandoned.

BACKGROUND OF THE INVENTION

1. Field of the Invention

The present invention relates to a method of growing large thin film single crystals and, more specifically, to a method of growing thin film crystals on substantially inert or amorphous substrates.

2. Prior Art

The use of single crystal semiconductor thin films in the manufacture of microelectronic thin film circuits has been severely hampered because of the limited area over which such single crystalline thin films can be grown. As a result, for many applications, the circuit designers must settle for a polycrystalline film which gives much poorer electrical performance and often precludes the device for many applications. Prior art methods of growing epitaxial layers are generally limited to growth upon a single crystal substrate whereby the area of the single crystal substrate is the maximum area to which the epitaxial layer may be grown. Because there is a maximum crystal size to which a single crystal substrate can be economically produced, the size of the epitaxial layer is also limited. Additionally, prior art growth methods require that the substrate have a temperature resistance at least equal to the crystallization temperature at which the growth takes place. Additionally, where a vapor growth process is used, the substrate must often withstand a chemically corrosive atmosphere at high temperatures. Finally, while epitaxially grown films offer a flexible method of obtaining impurity concentration profiles, as opposed to diffusion techniques, it is extremely difficult to grow or deposit such films through a mask in the desired pattern. Thus, to obtain a pattern from epitaxial growth, additional etching steps must be employed.

It has generally been accepted, that to grow single crystal films upon a single crystal substrate, the material must be deposited at a temperature above the epitaxial crystallization temperature so that the successive atoms being deposited may continue to form a growth pattern as a single crystal film.

Deposition below this temperature was found to result in either an amorphous film if deposited at low temperatures or a polycrystalline film if deposited at an intermediate temperature below the epitaxial crystallization temperature. It was thus believed that in heating an amorphous film, a polycrystalline film would be produced prior to the formation of a single crystal. Although Krikorian, ("Sputtering Parameters Affecting Epitaxial Growth of Semiconductor Single-Crystal Films", *Single-Crystal Films*, M. H. Francombe, H. Sato, Pergamon Press, Oxford, 1964, p. 113) experimentally located a "triple point" sputtering temperature at which amorphous, single crystal and polycrystalline films could be formed, only be extrapolation of the results was it suggested that an amorphous film could be directly converted to a single-crystal at relatively low temperatures.

Accordingly, since the polycrystalline intermediate phase has generally been assumed to exist below the epitaxial crystallization temperature, alternate schemes have required high temperature melting of the polycrystalline phase to form a single-crystal. U.S. Pat. No. 3,336,159 discloses the deposition of polycrystalline film onto what may be an amorphous substrate. This is followed by the heating of a single crystal in the polycrystalline film and then increasing the radius of the heating pattern so as to propagate that crystal throughout the film while melting all other crystals. Inherent in this process are the high melt temperatures as well as the requirement of selecting a suitable crystal in the polycrystalline film, carefully focusing the heat precisely around the crystal and radiating the heat outward so as to propagate that crystal and melt adjacent crystals to eliminate the danger of competing crystal growths. Where the beam is not precisely focused, more than one crystal may propagate, resulting in another polycrystalline film. Thus, it can be seen that great care must be taken in selecting the crystalline site, precisely measuring its position and dimension, and then precisely focusing the heat around it in order to generate a single crystal film.

OBJECTS OF THE INVENTION

It is an object of this invention to produce single crystal films, the area of which is not limited by the dimensions of a single crystal substrate.

It is yet another object of this invention to produce single crystal films upon substrates which heretofore could not be used because of their poor chemical or temperature resistance.

It is yet another object of this invention to provide single crystal films upon substantially or completely amorphous substrates.

It is but another object of this invention to provide multilayer single crystal films of varying compositions upon substantially or completely amorphous substrates.

SUMMARY OF THE INVENTION

The above objects are accomplished by depositing a completely amorphous film of the compound of the single crystal to be produced upon a substrate. For applications where a single crystal substrate is used, the material may be then bulk heated to a temperature such that epitaxial grains are nucleated and propagate through the amorphous layer producing a single crystal thin film. For applications where a substantially inert or amorphous substrate is used, a single crystal is either provided contiguous with the amorphous film and adjacent to the substrate or is first grown at the periphery of the amorphous film. A crystalline phase is then propagated from the single crystal across the amorphous film by passing a hot zone across the film at a sufficiently high temperature to cause crystallization, but well below the melt temperature.

BRIEF DESCRIPTION OF THE DRAWING

FIG. 7A-7D depict a method of growing multilayer amorphous films to crystalline films in multiple steps.

DETAILED DESCRIPTION

We have discovered that in order to form single crystal films, the film need not be deposited at high temperatures onto the substrate so that crystallization immediately occurs as was generally considered necessary in the prior art. Instead, a single crystal film can be produced if it is first deposited in an amorphous state. Deposition in the amorphous state gives several distinct advantages. By depositing the material in the amorphous state, low temperatures may be maintained. Thus, especially in vapor growth processes where the use of halogenated compounds often generates highly corrosive environments at high temperatures, substrates which do not have the temperature or chemical resistance to withstand such environments may be employed.

In particular, single crystal semiconductor films may be grown in this manner. We have found that the deposition of amorphous semiconductor materials, containing dopant atoms, may be converted to single crystals without significant change in the chemical composition since there is a low surface and volume diffusion at the conversion temperature. Thus, the required dopant concentration may be initially deposited without significant change upon conversion.

Having deposited an amorphous film, the processor may convert the film to a single crystal layer by a number of techniques within the scope of this invention, often depending upon the type substrate which has been used. In a situation where a high temperature resistance single crystal substrate is used, bulk heating of the amorphous film may be employed. We have found that upon heating, nucleation of epitaxial grains in the amorphous layers is produced and a boundary which converts the amorphous state to a crystalline one moves through the amorphous film. The migration of the boundary proceeds at a temperature considerably below the melt temperature of the substance, (approximately 340° C germanium and 850° C for $Y_3Ga_{1.1}Fe_{3.9}O_{12}$). Since the low temperature at which conversion takes place is such that volume and surface diffusion are small, the technique is particularly applicable to the conversion of multilayer thin films from the amorphous to crystalline state as later discussed.

Figure 1:
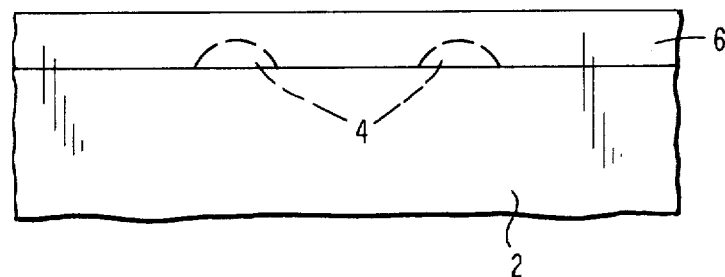
FIG. 1 is a cross-sectional view of an amorphous film on a crystalline substrate with subsequent conversion to a single crystal film by bulk heating and the formation of epitaxial grains.

FIG. 1 depicts the technique, as contemplated by this invention, of uniformly heating an amorphous film 6, deposited on a crystalline substrate 2, so that epitaxial grains 4 form and propagate through the film, resulting in a single crystal thin film.

Figure 2:
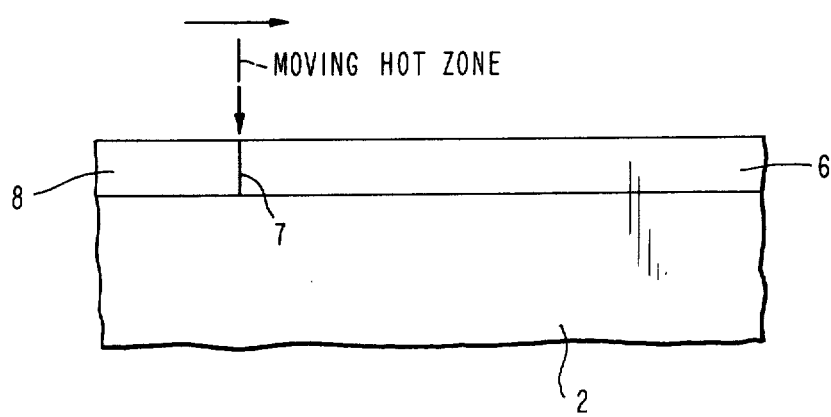
FIG. 2 depicts the growing of a crystalline film as shown in FIG. 1 by the passing of a hot zone across an amorphous film.

An alternate technique, as shown in FIG. 2, may be employed when the substrate crystal, 2, is adversely affected by bulk heating. Conversion may be accomplished by passing a hot zone, such as an electron beam, across the amorphous film, 6, to form an amorphous-crystalline boundary, 7, which converts the film from the amorphous to the crystalline state with a resulting single crystal, 8, produced with minimal heating of the substrate beneath.

The films contemplated by this invention, may be any material capable of being deposited in a stable amorphous state and which may be converted to a more stable crystalline state upon heating to the crystallization temperature. Materials which begin to crystallize at room temperature after being deposited in an amorphous state, should be maintained below room temperature so crystallization will not occur.

Figure 3:
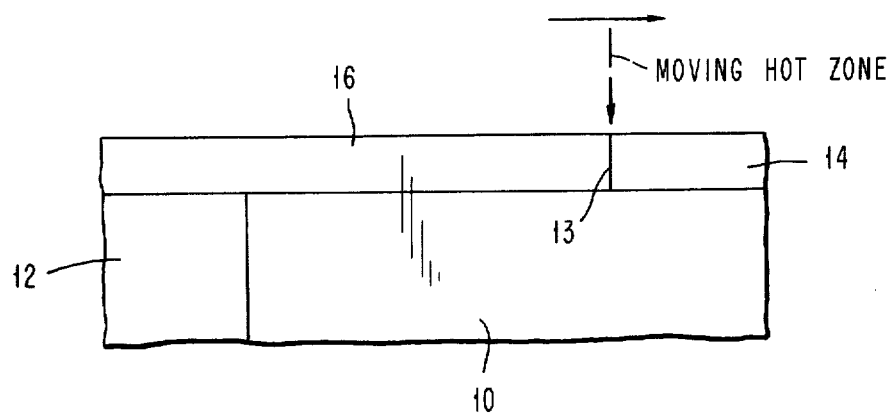
FIG. 3 shows the coversion of an amorphous to single crystal film which has been deposited upon a substantially inert of amorphous substrate but which has a single crystal substrate portion adjacent to the inert region and contiguous with the amorphous film.

Even more significant, is the application of this process to the formation of epitaxial single crystal thin films on substantially amorphous or inert support substrates. Referring to FIG. 3, by providing a single crystal substrate, 12, contiguous with a deposited amorphous film, 14, but having an area much smaller than the deposited film, the deposited film being substantially supported by an amorphous or inert substrate, 10, single crystal thin film, 16, may be grown to an area not limited to the size of the single crystal substrate. By initially heating that portion of the amorphous film contiguous with the single crystal substrate, nucleation of crystalline sites are formed in the amorphous film. The sites may then be propagated across the film including that portion of the film supported by the inert or amorphous substrate, by passing a hot zone across the film at a sufficient rate and temperature to form an amorphouscrystalline boundary, 13, and cause crystallization to occur. Again, since the amorphous film is locally heated the substrate may be one of low temperature resistance. Accordingly, flexible plastic supports which may later be stripped can be utilized in this process.

Figure 4A:
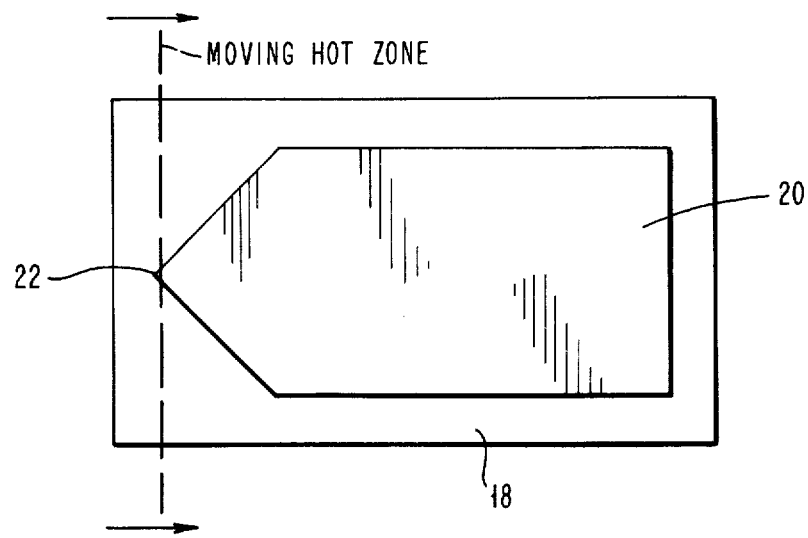
FIGS. 4A–4B depict a method of converting an amorphous to single crystal film when the amorphous film has been deposited on a completely amorphous or inert substrate.
Figure 4B:
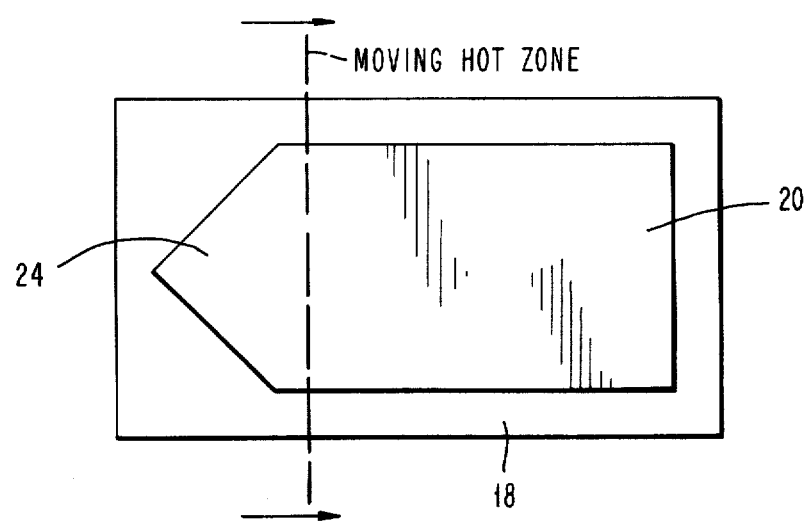

Referring to FIG. 4A, a single crystal can be formed on a completely inert support substrate, 18, which may be a completely amorphous material. This is accomplished by depositing an amorphous film, 20, in such a configuration that some peripheral part of the film comes to a point. By first heating the point of the amorphous film to its crystallization temperature, a seed crystal, 22, is produced. Then, by passing the hot zone from the seed crystal across the film, nucleation of a crystalline phase is propagated across the film to form a single crystal film, 24, as shown in FIG. 4B.

Figure 5:
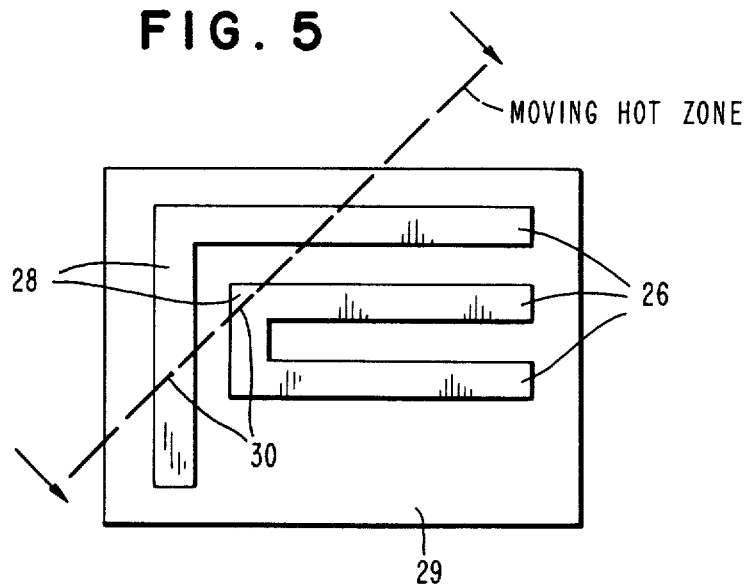
FIG. 5 depicts a method of forming single crystal patterns upon an amorphous or inert substrate.

This ability to convert a point on the amorphous film to a seed crystal and then grow the seed crystal by passing a hot zone across the film may be taken advantage of in the production of single crystal thin film patterns. FIG. 5 shows the deposition of an amorphous pattern, 26, on an inert or amorphous substrate 29 so that sharp corners are produced. A hot zone, 30, may be passed across the pattern so that the corner of the pattern is first heated thereby producing a seed crystal. The crystalline phase propagates across the entire pattern upon movement of the hot zone so that a single crystal, 28, thin film pattern is produced. Such patterns may be used for conductive lines or magnetic material such as magnetic bubble domains. Deposition of doped semiconductor material through a mask to form a desired pattern is easily accomplished when low temperatures are employed such as the deposition temperature of an amorphous material. On the other hand, direct epitaxial growth of a crystalline pattern through a mask is difficult to achieve due to the high temperatures required. Consequently, the prior art has generally contemplated epitaxial growth followed by an etching step to form the desired pattern. By directly depositing a patterned amorphous film and then converting the film to a single crystal film, as shown in FIG. 5, subsequent etching steps are eliminated.

Figure 6:
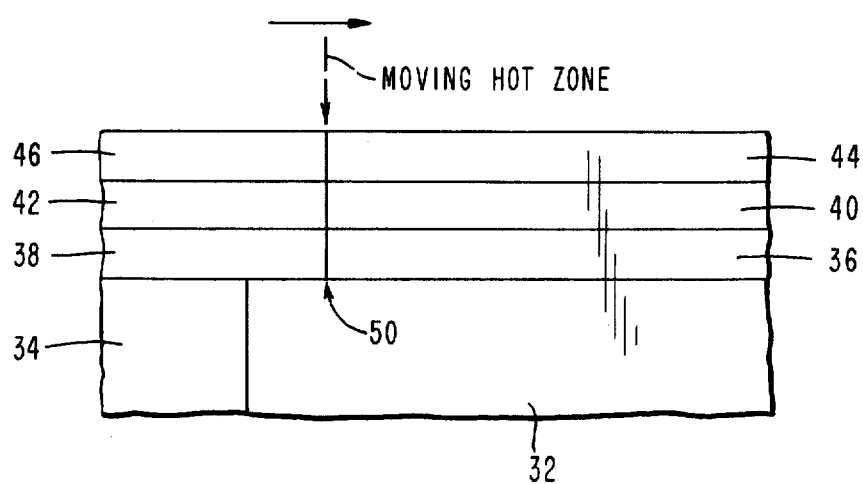
FIG. 6 depicts a method of converting multilayer amorphous films to crystalline films in a single step.

Referring now to FIG. 6, since, as previously discussed, the conversion of the amorphous film to the crystalline state requires relatively low temperatures compared with temperatures used for direct epitaxial growth, the technique of this invention is particularly applicable for the production of multilayer films. At the conversion temperature, the amount of surface and volume diffusion is insignificant. Thus, layers of amorphous films, with varying compositions, such as an amorphous film with a vairety of dopant levels, may be converted from the amorphous to the crystalline state with an insignificant amount of diffusion between layers. Layers of amorphous films, 36, 40 and 44, with varying composition, are sequentially deposited on a substrate having an inert support 32 and a single crystal 34. Then, by moving a hot zone across the multilayer films, the films are converted from the amorphous to crystalline state by the movement of an amorphous-crystalline interface, 50, across the multilayers corresponding to the moving hot zone. Yet, the chemical composition of each layer of the deposit is not substantially changed by boundary migration. Thus, single crystal films 38, 42 and 46 are produced.

Where no diffusion or migration between layers can be tolerated, multilayer crystalline films may be produced via a multistep process. Referring to FIG. 7A, a first amorphous film 36 is deposited upon a support substrate 32 which may have a substrate crystal 34 adjacent to it similar to the configuration shown in FIG. 3, or alternatively, may be deposited with a point pattern as discussed with reference to FIG. 4. By passing a hot zone across the amorphous film, as shown in FIG. 7A, a crystalline thin film, 38, is produced as depicted in FIG. 7B.

Figure 8A:
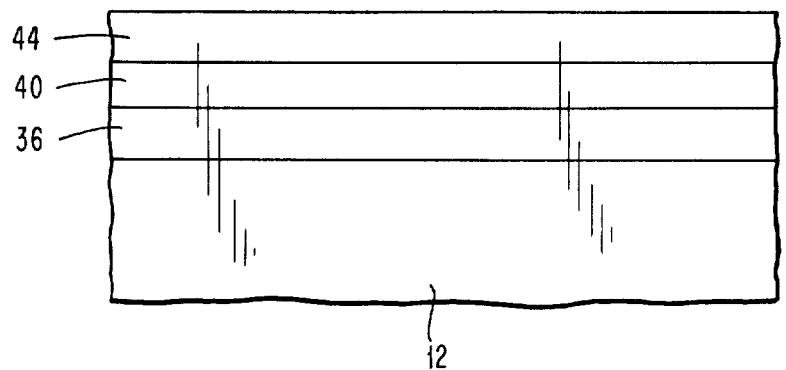
FIGS. 8A-8B depict a method of converting multilayer amorphous films which have been deposited upon a single crystal substrate to crystalline films by bulk heating.
Figure 8B:
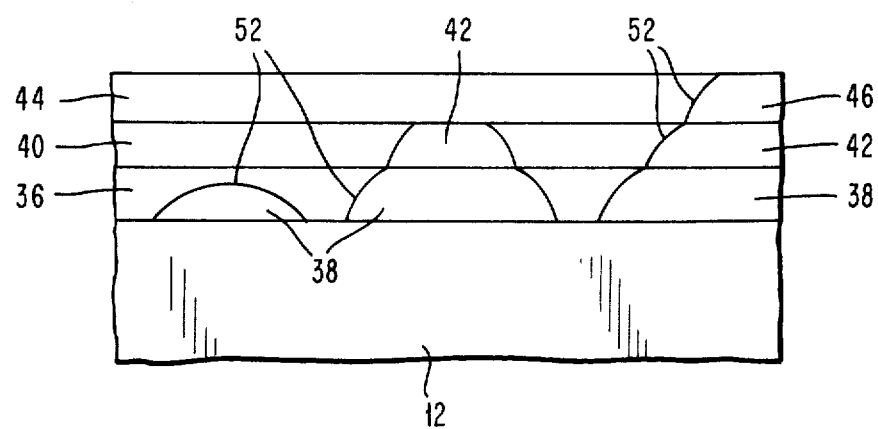

Referring now to FIG. 7C, a second amorphous film, 40, is deposited upon the first crystal thin film, 38, with nucleation of a crystalline phase from crystal 38 being propagated to crystal 42 by the movement of the hot zone. This step may be repeated to build up the desired number of layers, as shown in FIG. 7D where amorphous film 44 is converted to crystal 46. Finally, referring to FIG. 8A, where a single crystal substrate, 12, is employed, the amorphous layers may be converted to the crystalline state by bulk heating of the layers to their crystallization temperature. Again, since the high temperatures usually employed in direct epitaxial growth are not used, low surface and volume diffusion are maintained so that the chemical composition of crystals 38, 42 and 46 from amorphous films 36, 40 and 44 do not change. As shown in FIG. 8B, crystals 38, 42 and 46 are formed by the nucleation of an epitaxial phase from the single crystal substrate through the amorphous films 36, 40 and 44 via the propagation of an amorphous crystalline interface, 52, upward.

While the invention has now been described with particularity, the following examples are given as illustrations.

EXAMPLE I

An amorphous layer of $Y_3Ga_{1.1}Fe_{3.9}O_{12}$ is sputtered onto a substrate whose surface contains a single crystal $Gd_3Ga_5O_{12}$ and an amorphous layer of silicon dioxide. An electron beam is passed over the amorphous film beginning at the area over the $Gd_3Ga_5O_{12}$ crystal at such a rate that the amorphous film is heated to approximately 850° C. A crystalline phase is thus nucleated from the $Gd_3Ga_5O_{12}$ crystal into the $Y_3Ga_{1.1}Fe_{3.9}O_{12}$ amorphous film and then, the electron beam is passed over the substantially larger area of the amorphous film overlying the silicon dioxide surface with a resulting propagation of the crystalline phase through the amorphous film until the entire amorphous film has been heated and converted into a single crystal film of composition $Y_3Ga_{1.1}Fe_{3.9}O_{12}$.

EXAMPLE II

An amorphous layer of $Y_3Fe_5O_{12}$ is deposited onto a substrate which contains a single crystal of $Sm_3Ga_5O_{12}$. The layer is processed as in Example I so that a single crystal film of $Y_3Fe_5O_{12}$ is formed.

EXAMPLE III

An amorphous layer of $Y_3(GaFe)_5O_{12}$ is deposited on a substrate which contains a single crystal of $Gd_3Ga_5O_{12}$. The layer is processed as in Example I so that a single crystal film of $Y_3(GaFe)_5O_{12}$ is produced.

EXAMPLE IV

An amorphous layer of $(GdY)_3(GaFe)_5O_{12}$ is deposited on a substrate which contains a single crystal of $Gd_3Ga_5O_{12}$. The layer is processed as in Example I so that a single crystal film of $Y_3(GaFe)_5O_{12}$ is produced.

EXAMPLE V

An amorphous silicon dioxide layer is deposited upon a high temperature quartz substrate. An amorphous silicon film containing approximately $10^{20}$ atoms/cc of boron is deposited upon the $SiO_2$ in a pattern such that one end of the film necks to a point. An electron beam is then focused on the point to a temperature of approximately 800° C to convert the amorphous film at that point to a seed crystal. The electron beam is the passed from the point across the film whereby the seed crystal nucleates a crystalline phase. After passing the electron beam across the entire surface of the film a single crystal thin film is produced. A second layer of semiconductor material, such as silicon doped with about $10^{18}$ atoms/cc of phosphorus may now be deposited in the amorphous state. By passing a hot zone across this amorphous film, a single crystal phosphorus doped silicon film is formed in the orientation of the previously converted boron doped silicon crystal. Since the temperatures at which conversion takes place is relatively low, diffusion between layers is minimized so that two single crystal films may be produced with substantially different conductivity types.

While the invention has been shown and described with reference to the preferred embodiments thereof, it will be appreciated by those of skill in the art that variations in form may be made therein without departing from the spirit and scope of the invention.

What is claimed is:

1. A method of growing a single crystal thin film on a substantially inert substrate comprising the steps of:

depositing an amorphous film onto said inert substrate at a temperature below the crystallization temperature of said amorphous film to form a peripheral part of said amorphous film in a point;

locally heating said peripheral part of said amorphous film to its crystallization temperature to form a single crystal; and passing continuously from said single crystal across said amorphous film a hot zone at a temperature below the melt temperature of said amorphous film but sufficiently high to propagate a crystalline phase through said amorphous film, whereby a single crystal thin film is produced.

2. A method of growing multilayer single crystal thin films of respectively different compositions on a substrate surface comprising a substantially inert portion and a contiguous single crystal portion including the steps of:

depositing a first amorphous film of a first composition onto said substrate at a temperature below the crystallization temperature of said first amorphous film;

passing continuously across said first amorphous film from said single crystal contiguous with said first amorphous film a hot zone at a temperature well below the melt temperature of said first amorphous film but sufficiently high to nucleate and to propagate a monocrystalline phase in said first amorphous film, whereby a first single crystal thin film is produced;

depositing a second amorphous film of a second composition on said first single crystal thin film at a temperature below the epitaxial crystallization temperature of said second amorphous film; and passing continuously across said second amorphous film hot zone at a temperature well below the melt temperature of said second amorphous film but sufficiently high to nucleate and to propagate a monocrystalline phase in said second amorphous film, whereby a second single crystal thin film is produced.

* * * * *